(12) United States Patent
Chen et al.

(10) Patent No.: US 10,164,213 B2
(45) Date of Patent: Dec. 25, 2018

(54) FLEXIBLE DISPLAY PANEL, METHOD FOR FABRICATING THE SAME, AND APPARATUS FOR FORMING THE SAME

(71) Applicant: BOE TECHNOLOGY GROUP CO., LTD, Beijing (CN)

(72) Inventors: Liqiang Chen, Beijing (CN); Tao Sun, Beijing (CN); Baoming Cai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 15/031,252

(22) PCT Filed: Sep. 18, 2015

(86) PCT No.: PCT/CN2015/089923
§ 371 (c)(1),
(2) Date: Apr. 21, 2016

(87) PCT Pub. No.: WO2016/127642
PCT Pub. Date: Aug. 18, 2016

(65) Prior Publication Data
US 2016/0359137 A1    Dec. 8, 2016

(30) Foreign Application Priority Data

Feb. 12, 2015   (CN) .......................... 2015 1 0076818

(51) Int. Cl.
*H01L 27/00* (2006.01)
*H01L 51/52* (2006.01)
(Continued)

(52) U.S. Cl.
CPC .......... *H01L 51/5253* (2013.01); *H01L 21/77* (2013.01); *H01L 25/167* (2013.01);
(Continued)

(58) Field of Classification Search
CPC ... H01L 51/5253; H01L 21/77; H01L 25/167; H01L 25/50; H01L 29/78603;
(Continued)

(56) References Cited

U.S. PATENT DOCUMENTS

| 6,355,125 B1 | 3/2002 | Tahon |
| 2006/0270304 A1 | 11/2006 | Aita |

(Continued)

FOREIGN PATENT DOCUMENTS

| CN | 1870842 | 11/2006 |
| CN | 101364609 A | 2/2009 |

(Continued)

OTHER PUBLICATIONS

The World Intellectual Property Organization (WIPO) International Search Report and Written Opinion for PCT/CN2015/089923 dated Nov. 30, 2015 13 Pages.

(Continued)

*Primary Examiner* — Mounir Amer
*Assistant Examiner* — Alexander Belousov
(74) *Attorney, Agent, or Firm* — Anova Law Group, PLLC

(57) ABSTRACT

The present disclosure provides a method for bonding an integrated circuit (IC) chip onto a flexible display body. The method includes providing a substrate having a flexible display body thereon, and aligning a first stiffening component with the flexible display body having an IC bonding region. The method further includes attaching the first stiffening component onto a front surface of the flexible display body, and separating the substrate from the first stiffening component and the flexible display body to expose a back surface of the flexible display body; and bonding an IC chip onto the IC bonding region.

15 Claims, 6 Drawing Sheets

(51) Int. Cl.
*H01L 21/77* (2017.01)
*H01L 25/16* (2006.01)
*H01L 25/00* (2006.01)
*H01L 51/56* (2006.01)
*H01L 29/786* (2006.01)
H01L 27/32 (2006.01)
H01L 23/544 (2006.01)
H01L 21/683 (2006.01)

(52) U.S. Cl.
CPC ........ H01L 25/50 (2013.01); H01L 29/78603 (2013.01); H01L 51/56 (2013.01); H01L 21/6835 (2013.01); H01L 23/544 (2013.01); H01L 27/3276 (2013.01); H01L 51/524 (2013.01); H01L 2221/6835 (2013.01); H01L 2223/54473 (2013.01); H01L 2223/54486 (2013.01); H01L 2227/326 (2013.01); H01L 2251/5338 (2013.01)

(58) Field of Classification Search
CPC ... H01L 51/56; H01L 27/3276; H01L 51/524; H01L 2227/326; H01L 2251/5338
See application file for complete search history.

(56) References Cited

U.S. PATENT DOCUMENTS

| | | | |
|---|---|---|---|
| 2009/0039760 | A1 | 2/2009 | Kwon et al. |
| 2011/0037059 | A1* | 2/2011 | Gyoda ............... H01L 27/3276 257/40 |
| 2011/0122559 | A1 | 5/2011 | Lee et al. |
| 2014/0268595 | A1 | 9/2014 | Eom et al. |
| 2015/0192961 | A1 | 7/2015 | Zhou |
| 2015/0201498 | A1* | 7/2015 | Lin .................. G02F 1/1333 361/749 |
| 2016/0268313 | A1 | 9/2016 | Qin et al. |
| 2016/0359137 | A1 | 12/2016 | Chen et al. |

FOREIGN PATENT DOCUMENTS

| | | | |
|---|---|---|---|
| CN | 101833904 A | 9/2010 | |
| CN | 102983155 A | 3/2013 | |
| CN | 103247233 A | 8/2013 | |
| CN | 103646611 A | 3/2014 | |
| CN | 103928473 A | 7/2014 | |
| CN | 104167429 A | 11/2014 | |
| CN | 104658972 A | 5/2015 | |
| CN | 204391114 U | 6/2015 | |
| EP | 1584971 A1 | 10/2005 | |
| EP | 3176825 A1 | 6/2017 | |
| KR | 20130024097 A | 3/2013 | |
| KR | 20130049106 A | 5/2013 | |
| KR | 20140138585 A | 12/2014 | |

OTHER PUBLICATIONS

State Intellectual Property Office of the P.R.C (SIPO) Office Action 1 for 2015100768186 dated Feb. 20, 2017 24 Pages.
Korean Intellectual Property Office (KIPO) Office Action 1 for 20167031640 dated Dec. 21, 2017 19 Pages (including translation).
The European Patent Office (EPO), The Extended European Search Report for 15851611.2, dated Oct. 11, 2018, 9 Pages.
Haskal E I et al: "Flexible OLED displays made with the EPLaR process", Proceedings of the 27th International Display Research Conference; [Sep. 18-20, 2007, Office Building of the Russian Academy of Sciences, Moscow, RUS, XX, RU, Sep. 18, 2007 (Sep. 18, 2007), pp. 36-39, XP008128268.

* cited by examiner

FLEXIBLE DISPLAY PANEL, METHOD FOR FABRICATING THE SAME, AND APPARATUS FOR FORMING THE SAME

CROSS-REFERENCES TO RELATED APPLICATIONS

This application is a national phase entry under 35 U.S.C. § 371 of International Application No. PCT/CN2015/089923, filed on Sep. 18, 2015, which claims priority to Chinese Patent Application No. 201510076816.6, filed on Feb. 12, 2015. The above enumerated patent applications are incorporated by reference herein in their entirety.

FIELD OF THE INVENTION

The present invention generally relates to the display technologies and, more particularly, relates to a flexible display panel, a method for fabricating the same, and an apparatus for forming the same.

BACKGROUND

A flexible display panel often includes a flexible display body and corresponding integrated circuit (IC) chips. The IC chip is often bonded onto the flexible display body for forming the flexible display panel.

In an existing method for fabricating the display panel, laser is often used to lift off or separate the flexible display body from a glass or plastic substrate. The IC chip is further bonded onto the flexible display body to form a flexible display panel.

However, in the existing method for fabricating the display panel, when the flexible display body is separated from the glass substrate, the flexible display body is susceptible to curling or folding because of its thinness. Particularly, the curling of the portion of the flexible display body corresponding to the IC chip may adversely affect the accuracy of alignment when the IC chip is bonded onto the flexible display body. As a result, it may be difficult to bond the IC chip onto the flexible display body.

BRIEF SUMMARY OF THE DISCLOSURE

The present invention addresses the above problems in the prior art. The present disclosure provides a flexible display panel, a method for fabricating the flexible display panel, and an apparatus for bonding the IC chip onto the flexible display body to form the flexible display panel.

One aspect of the present disclosure provides a method for bonding an integrated circuit (IC) chip onto a flexible display body. The method includes providing a substrate having a flexible display body thereon; aligning a first stiffening component with the flexible display body having an IC bonding region; attaching the first stiffening component onto a front surface of the flexible display body; separating the substrate from the first stiffening component and the flexible display body to expose a back surface of the flexible display body; and bonding an IC chip onto the IC bonding region.

Optionally, the first stiffening component includes, before aligning the first stiffening component with the flexible display body, an opening region, a main stiffening region, and side stiffening portions surrounding the opening region of the first stiffening component for exposing the IC bonding region.

Optionally, the method further includes aligning a second stiffening component with the flexible display body; and attaching the second stiffening component onto the back surface of the flexible display body.

Optionally, the first stiffening component comprises an encapsulation layer with a water-repellent layer and a surface-adhesive layer, the water-repellent layer being attached on the surface-adhesive layer and the surface-adhesive layer being attached on the front surface of the flexible display body.

Optionally, the substrate is separated from the first stiffening component and the flexible display body by laser or by a punching process.

Optionally, the method further includes applying an anisotropic conductive adhesive onto the IC bonding region before bonding the IC chip onto the IC bonding region.

Optionally, the side stiffening portions are configured to extend from the main stiffening region to be attached onto at least two sides of the IC bonding region for providing support to the IC bonding region.

Optionally, the main stiffening region corresponds to a display region of the flexible display body.

Optionally, the second stiffening component comprises a back film.

Optionally, the second stiffening component includes an opening region, a main stiffening portion region, and side stiffening portions surrounding the opening region of the second stiffening component corresponding to an area of the IC bonding region.

Optionally, the second stiffening component has contact with a back surface of the IC bonding region to provide support.

Optionally, the main stiffening portion region of the second stiffening component corresponds to a display region of the flexible display body and the side stiffening portions of the second stiffening component are configured to extend from the main second stiffening portion region to be attached onto at least two sides of the back surface of the IC bonding region for providing support to the IC bonding region.

Optionally, the method further includes attaching a supporting pad from below the back surface of the flexible display body to contact a back surface of the IC bonding region, wherein a surface area of the supporting pad fits an area of the second opening region and a thickness of the supporting pad being same as a thickness of the second stiffening component.

Optionally, a process to attach the supporting pad onto the back surface of the IC bonding region includes fixing the supporting pad on a platform of a bonding machine; and moving the platform towards the back surface of the flexible display body to place the supporting pad in the second opening region and form a contact surface with the back surface of the IC bonding region.

Another aspect of the present disclosure provides a display panel. The display panel includes a flexible display body with a display region and an IC bonding region; a stiffening component; and an integrated circuit (IC) chip. The stiffening component is attached to a front surface of the flexible display; and the IC chip is bonded on the IC bonding region.

Optionally, the stiffening component includes an opening region, a main stiffening portion, and side stiffening portions surrounding the opening region of the first stiffening component for exposing the IC bonding region, the side stiffening portions extending from the corresponding main stiffening portion.

Optionally, the stiffening component comprises an encapsulation layer of the flexible display body attached on a front surface of the flexible display body.

Optionally, the encapsulation layer includes a water-repellent layer and a surface-adhesive layer, the water-repellent layer being attached on the surface-adhesive layer and the surface-adhesive layer being attached on the front surface of the flexible display body.

Optionally, the display panel further includes another stiffening component attached on a back surface of the flexible display body to provide support, wherein the other stiffening component includes an opening region, a main stiffening portion, and side stiffening portions surrounding the opening region of the other stiffening component corresponding to an area of the IC bonding region.

Optionally, the other stiffening component comprises a back film of the flexible display body attached on a back surface of the flexible display body.

Optionally, a platform with a supporting pad is configured for attaching the supporting pad at a back surface of the IC bonding region for providing support to the IC bonding region, wherein a thickness of the supporting pad is same as a thickness of the second stiffening component.

Optionally, the other stiffening component further includes a direct stiffening portion corresponding to the IC bonding region, the direct stiffening portion being connected to the main stiffening portion and the side stiffening portions.

Optionally, the IC chip is configured to form an electrical connection with the flexible display body.

Another aspect of the present disclosure provides a display apparatus. The display apparatus includes the disclosed display panel.

Another aspect of the present disclosure provides an apparatus for forming the disclosed display panel. The apparatus includes a platform and a supporting pad fixed on the platform, wherein the supporting pad is configured to provide support to the IC bonding region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
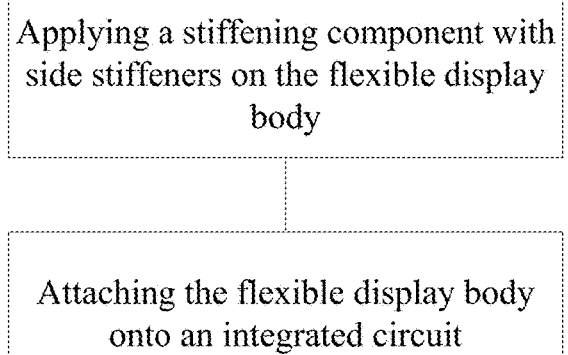
FIG. 1 illustrates an exemplary process of the method for fabricating the flexible display panel according to the embodiments of the present disclosure.
Figure 2:
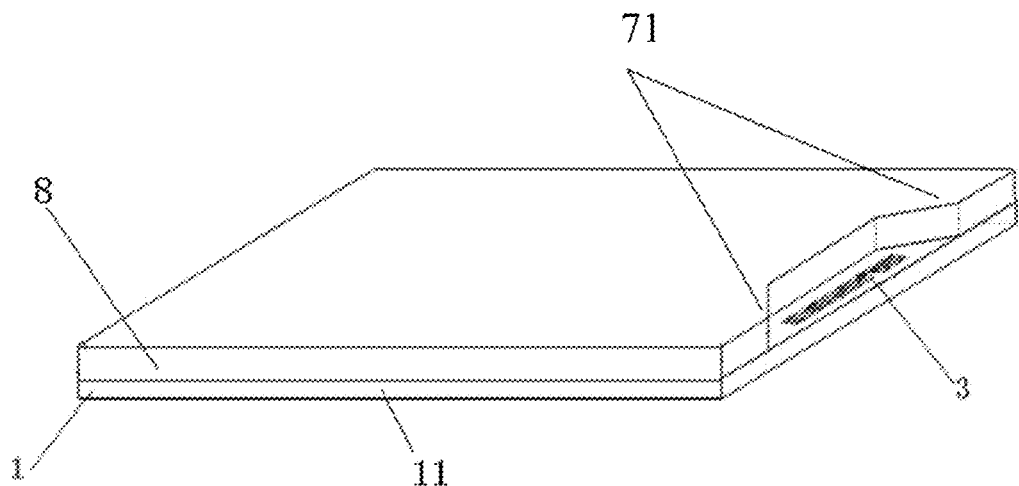
FIG. 2 illustrates the structure of an exemplary flexible display panel according to the embodiments of the present disclosure.

One aspect of the present disclosure provides method for bonding an integrated circuit (IC) chip onto a flexible display body. FIG. 1 illustrates a process for fabricating a display panel. FIG. 2 illustrates certain portions of the display panel using the method according to the present disclosure.

As shown in FIGS. 1 and 2, a substrate (not shown) may first be provided. The substrate may include a flexible display body 1 thereon. A stiffening component 8 may be aligned with the first flexible display body 1 and further placed on the flexible display body 1. An IC bonding region is included on the flexible display body 1. The IC bonding region may correspond to the area where the IC chip 3 is bonded onto the flexible display body 1. The stiffening component 8 may include side stiffening portions 7 to correspond to at least two sides of the IC bonding region. The substrate may be separated from the flexible display body 1 and the stiffening component 8 to expose the back surface of the flexible display body 1.

Further, the IC chip 3 may be bonded onto the IC bonding region on the flexible display body 1.

In one embodiment, the flexible display body 1 may be a flexible display panel. In another embodiment, the flexible display body 1 may be a combination of a flexible display substrate and a display unit. The flexible display body 1 may include components for displaying images such as organic light-emitting diode (OLED) pixels and thin-film transistor (TFT) circuits for driving and operating the pixels. The disclosed method for fabricating the flexible display panel or the flexible display substrate uses the stiffening component 8 on the flexible display body 1 to provide or improve support to the flexible display body 1. With the support provided by the stiffening component 8, the flexible display body 1 may be prevented from curling after being separated from the glass substrate.

In addition, the stiffening component 8 may include side stiffening portions 71, corresponding to at least two sides of the IC bonding region. The sides of the IC bonding region may refer to all the sides or side areas neighboring the IC chip 3. The sides or side areas may surround the IC chip 3. A portion of the stiffening component 8 may be positioned in at least two sides of the bonding region of the IC chip 3 such that the side stiffening portions 71 may provide support to the IC chip 3 on the flexible display body 1 to prevent the IC bonding region from folding or curling. Thus, the IC chip 3 can be bonded to the flexible display body 1 with higher accuracy, and the bonding process can be easy to implement.

Figure 3:
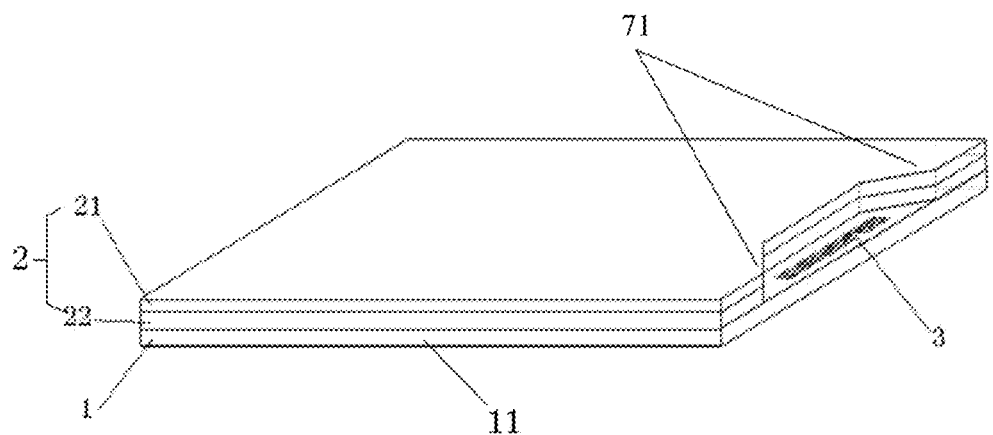
FIG. 3 illustrates the structure of another exemplary flexible display panel according to the embodiments of the present disclosure.
Figure 4:
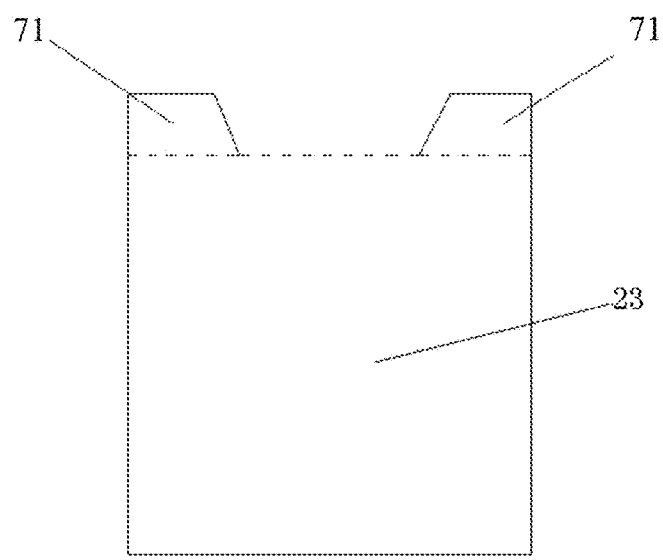
FIG. 4 illustrates the structure of an exemplary encapsulation layer according to the embodiments of the present disclosure.

As further shown in FIGS. 3 and 4, the stiffening component 8 may be an encapsulation layer 2 of the flexible display body 1. In other words, the stiffening component 8 may be a sealing portion of the flexible display body. The encapsulation layer 2 may include a main encapsulation portion 23. The main encapsulation portion 23 may correspond to the display region 11 of the flexible display body 1. The main encapsulation portion 23 may extend to form the side stiffening portions 71.

The stiffening component 8 may be formed in various ways. In one embodiment, the encapsulation layer 2 of the flexible display body 1 may be used as the stiffening component 8. When the flexible display body 1 is being encapsulated or packed, the flexible display body 1 may be supported by the encapsulation layer 2 such that the flexible display body 1 is prevented from curling after being separated from the glass or plastic substrate. The pattern of the encapsulation layer 2 can be formed through a suitable patterning process.

Figure 8:
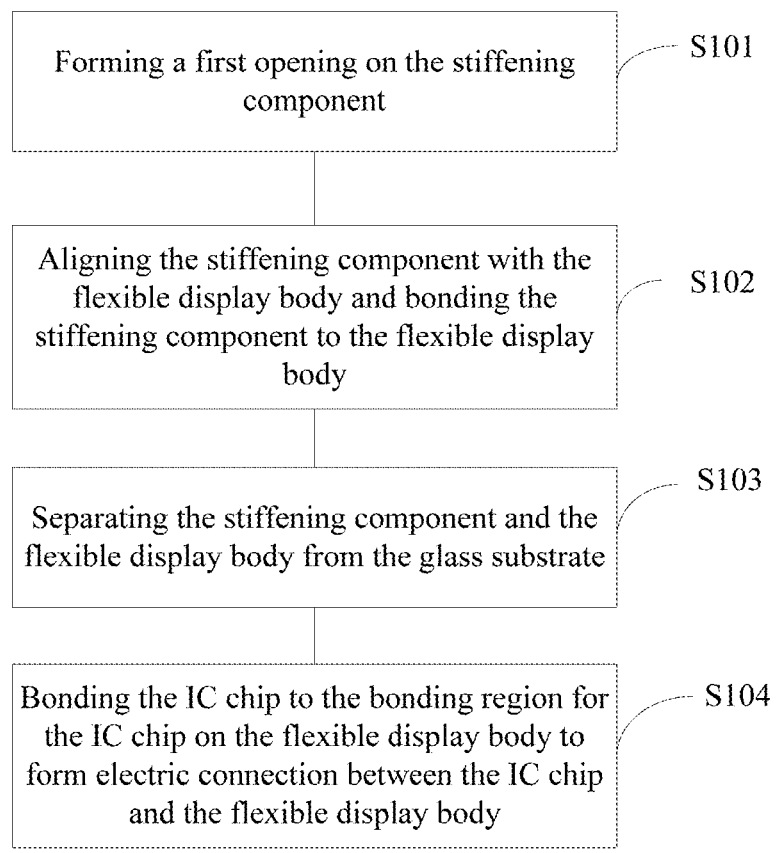
FIG. 8 illustrates an exemplary process to form a plurality of flexible display panels according to the embodiments of the present disclosure.

Specifically, the method may include steps S101 to S104, as shown in FIG. 8.

In step S101, a first opening may be formed on the stiffening component 8. The stiffening component 8 may be formed by any suitable cutting process. The first opening may correspond to the IC bonding region on the flexible display body 1. The IC bonding region may be reserved for subsequent bonding process. Two side portions of the first opening, i.e., two portions on the two sides of the first opening, may be the side stiffening portions 71. The rest of the stiffening component 8, i.e., besides the side stiffening portions 71, may be the main encapsulation portion 23. The main encapsulation portion 23 may correspond to the display region 11 of the flexible display body 1. The stiffening component 8 may be formed through various means such as a single-layered adhesive/bonding film with certain thickness and certain mechanical strength or a multiple-layered adhesive or bonding film. The multiple-layered covering film may be formed by a plurality of single-layered adhesive or bonding films stacked together.

When encapsulating the disclosed flexible display panel, a stiffening component 8 may be first provided. A first opening may be cut or formed on the stiffening component 8 to pattern the stiffening component 8. The first opening may correspond to the IC bonding region on the flexible display body 1 to ensure the stiffening component 8 can cover at least two sides of the IC bonding region. For example, in one embodiment, when the stiffening component 8 is aligned with the IC chip 3, the position of the first opening on the stiffening component 8 may match the position of the IC chip 3 on the flexible display body 1. Portions of the stiffening component 8 may extend to the two sides of the IC chip 3. That is, the side stiffening portions 71 may cover the two sides of the IC chip 3. The IC chip 3 may be exposed by the first opening such that the IC chip 3 is not electrically connected to other parts of the flexible display body 1. The area of the first opening may be equal to or larger than the area of the IC chip 3 to ensure the IC chip 3 may be exposed by the first opening.

In step S102, the stiffening component 8 may be aligned with and bonded or attached to the flexible display body 1 such that the main encapsulation portion 23 correspond to the display region 11 of the flexible display body 1 and the two side stiffening portions 71 may be bonded onto the two sides of the IC chip 3. The flexible display body 1 may be attached to a glass substrate.

The flexible display body 1 may be kept on the glass substrate. The edges of the stiffening component 8 may be aligned with the edges of the flexible display body 1, and the first opening on the stiffening component 8 may be aligned with the IC bonding region on the flexible display body 1 to ensure the IC chip 3 can be exposed by the first opening. Further, the stiffening component 8 and the flexible display body 1 may be bonded by a suitable glue or adhesive.

In step S103, the stiffening component 8 and the flexible display body 1 may be separated from the glass substrate together.

The stiffening component 8 and the flexible display body 1 may be separated from the glass substrate together using laser radiation. Because the stiffening component 8 is bonded to the flexible display body 1 to improve support, the flexible display body 1 may be less susceptible to curling. The IC bonding region may be prevented from folding. The subsequent bonding of the IC chip 3 to the IC bonding region may be more accurate and more convenient.

In step S104, the IC chip 3 may be bonded to the IC bonding region on the flexible display body 1 to form electric connection between the IC chip 3 and the flexible display body 1.

An anisotropic conductive glue or adhesive may be applied on one side of the flexible display body 1. Specifically, the anisotropic conductive glue may be applied in the area defined by the first opening.

Further, a bonding machine may be used to align the IC chip 3 with the flexible display body 1. The probes of charge-coupled device (CCD) on the bonding machine may be used to detect and locate the alignment marks on the flexible display body 1 and the IC chip 3. The bonding machine may move the flexible display body 1 to a proper position such that the alignment marks on flexible display body 1 can match the alignment marks on the IC chip 3 accurately. Thus, the flexible display body 1 may be aligned with the IC chip 3 accurately. The bonding machine may mount and apply pressure on the IC chip 3 onto the anisotropic conductive glue on the flexible display body 1. The process of applying pressure may be referred as a pre-pressing process.

Further, the bonding machine may be used to provide suitable heating to the IC chip 3 and apply certain pressure on the IC chip 3. In this case, the process of applying pressure may be referred as a pressing process. The IC chip 3 may form electric connection with the metal wiring on the flexible display body 1. The heating and the pressing process may enable the anisotropic conductive glue to solidify. The IC chip 3 may be bonded to the flexible display body 1.

The stiffening component 8 may be about 50 μm to about 100 μm. In one embodiment, the stiffening component 8 may have a desired thickness to ensure sufficient support for the IC bonding region. For example, the stiffening component 8 may be sufficiently thick and may be about 100 μm.

As shown in FIG. 3, the encapsulation layer 2 may include a water-repellent layer 21 and a surface-adhesive layer 22. The water-repellent layer 21 may be bonded to the surface-adhesive layer 22, and the surface-adhesive layer 22 may be further bonded to the flexible display body 1.

The encapsulation layer 2 may be formed by various means. In one embodiment, the water-repellent layer 21 and the surface-adhesive layer 22 may be adhered or bonded together. The water-repellent layer 21 may be an aqueous oxygen barrier layer. The water-repellent layer 21 may be bonded to the flexible display body 1 through the surface-adhesive layer 22. In one embodiment, the water-repellent layer 21 may have a desired thickness to provide sufficient support to the flexible display body 1. When the water-repellent layer 21 and the surface-adhesive layer 22 are bonded onto the flexible display body 1, the first opening may be formed on the water-repellent layer 21 and the surface-adhesive layer 22 separately, e.g., the first opening on the water repellent layer 21 and the first opening on the surface-adhesive layer 22 may be cut separately. Alternatively, the water-repellent layer 21 and the surface-adhesive layer 22 may be bonded onto the flexible display body 1 and the first opening may be formed (e.g., cut) in the water-repellent layer 21 and the surface-adhesive layer 22 together. The side stiffening portions 71 may cover both the water-repellent layer 21 and the surface-adhesive layer 22. By aligning the water-repellent layer 21 and the surface-adhesive layer 22 with the flexible display body 1 and bonding the water-repellent layer 21 and the surface-adhesive layer 22 onto the flexible display body 1 with pressure, the side stiffening portions 71 may correspond to the sides of the IC bonding region to provide support for the flexible display body 1. Thus, the flexible display panel can be encapsulated.

Figure 6:
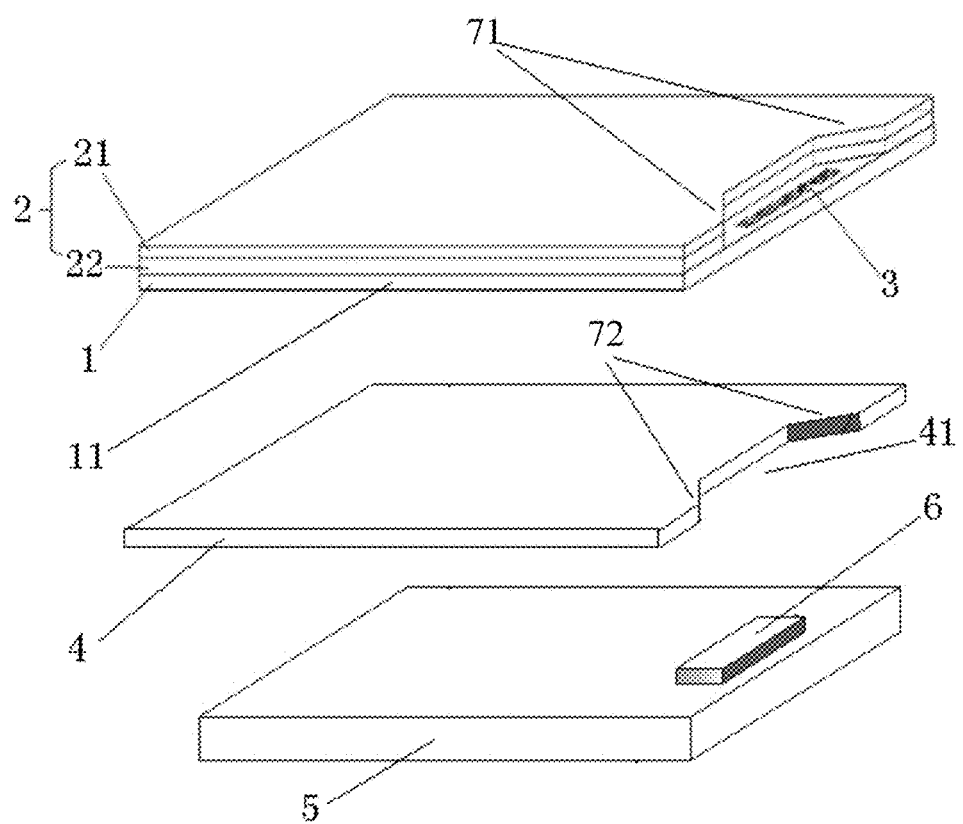
FIG. 6 illustrates the structure of another exemplary flexible display panel according to the embodiments of the present disclosure.
Figure 7:
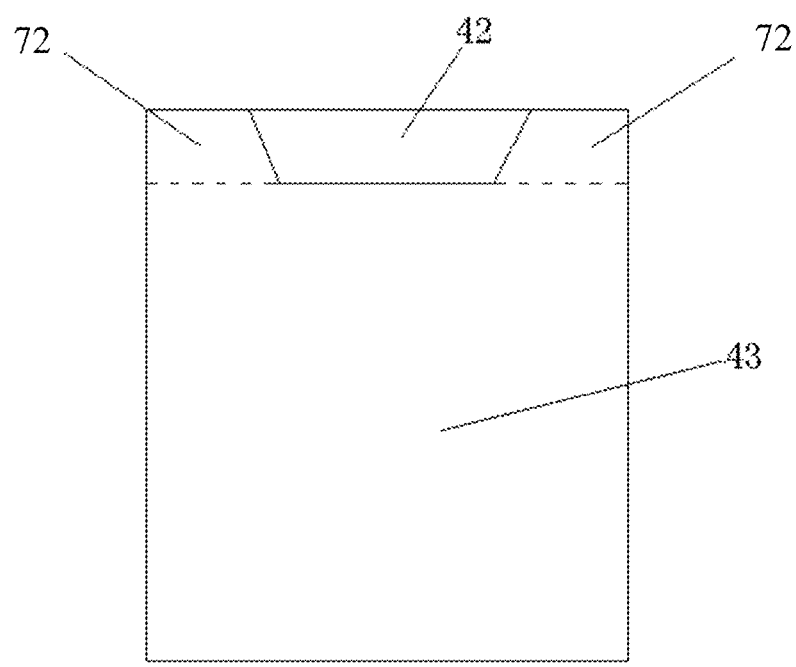
FIG. 7 illustrates the structure of an exemplary stiffening film according to the embodiments of the present disclosure.

As shown in FIG. 6 and FIG. 7, the stiffening component 8 may also include a stiffening film 4. The stiffening film 4 may be aligned with the flexible display body 1 and bonded to the other surface of the flexible display body 1, i.e., the surface not bonded with the encapsulation layer 2. The stiffening film 4 may include a main stiffening film portion 43 corresponding to the display region 11 of the flexible display body 1, and side stiffening portions 72 extended from the main stiffening film portion 43. The main stiffening film portion 43 and the side stiffening portions 72 may form an opening region 41 through a patterning process. The opening region 41 may correspond to the IC bonding region.

In certain embodiments, the stiffening film 4 may be included when the encapsulation layer 2, e.g., the water-repellent layer 21 and the surface-adhesive layer 22, is not able to provide sufficient support to the IC bonding region on the flexible display body 1.

In one embodiment, the stiffening component 8 may include two layers, i.e., the encapsulation layer 2 and the stiffening film 4. The encapsulation layer 2 may be bonded to one surface (e.g., the front surface) of the flexible display body 1 and the stiffening film 4 may be bonded to the other surface (e.g., the back surface) of the flexible display body 1. That is, in practice, when more support for the flexible display body 1 is required, a stiffening film 4 may be bonded to the other surface of the flexible display body 1, i.e., the surface not bonded with the encapsulation layer 2. The stiffening film 4 may provide additional support to the encapsulation layer 2 for supporting the flexible display body 1. The main stiffening film portion 43 on the stiffening film 4 may correspond to the display region 11 of the flexible display body 1. The portions extended from the main stiffening film portion 43 may be the side stiffening portions 72. Similarly to the side stiffening portions 71, the side stiffening portions 72 may be bonded onto the sides of the IC bonding region to provide support for the bonding region.

As shown in FIG. 6, in one embodiment, the stiffening component 8 may be the stiffening film 4. The stiffening film 4 may be bonded on the other surface, i.e., the side not bonded with the encapsulation layer 2, of the flexible display body 1. The stiffening film 4 may include a main stiffening film portion 43 corresponding to the display region 11 of the flexible display body 1, and side stiffening portions 72 extended from the main stiffening film portion 43. The main stiffening film portion 43 and the side stiffening portions 72 may form an opening region 41. The opening region 41 may correspond to the IC bonding region.

In one embodiment, the stiffening component 8 may only include a single-layered stiffening film 4. As shown in FIG. 7, the single-layered stiffening film 4 may be bonded on the other surface, i.e., the side not bonded with the encapsulation layer 2, of the flexible display body 1. Similarly, the stiffening film 4 may include a main stiffening film portion 43 corresponding to the display region 11 of the flexible display body 1, and side stiffening portions 72 extended from the main stiffening film portion 43. The side stiffening portions 72 may be bonded on the sides of the IC bonding region to provide sufficient support to the flexible display body 1. Thus, the flexible display body 1 may be prevented from curling or folding.

As shown in FIG. 6, in one embodiment, the main stiffening film portion 43 and the side stiffening portions 72 may form an opening region 41. A suitable patterning process may be used to remove the portion of the stiffening film 4 to form the opening region 41. The device or machine used for bonding the IC chip 3 onto the IC bonding region on the flexible display body 1 may include a platform 5. A supporting pad 6 may be fixed on the platform 5. The supporting pad 6 may be used to provide support to the IC bonding region in the opening region 41.

The stiffening film 4 may be a back film. A back film often has large elastic modulus. Under pressure, a back film is less susceptible to sagging. Considerable sagging of the flexible display body 1 may cause the metal wires connecting the IC chip 3 and the flexible display body 1 to break. Thus, the supporting pad 6 may be added to provide protection and support to the metal wires connecting the IC chip 3 and the flexible display body 1. The back film may be made of polyethylene terephthalate (PET), Poly (ethylene-2,6-naphthalate) (PEN) mixed with acrylic adhesive, and/or other suitable materials.

In one embodiment, when in operation, the flexible display body 1 may be placed flat on a supporting surface. As shown in FIGS. 6 and 7, the encapsulation layer 2 and the IC chip 3 may be placed on the front surface of the flexible display body 1, and the stiffening film 4 may be bonded on the back surface of the flexible display body 1. The area defined by the main stiffening film portion 43 and the side stiffening portions 72 may correspond to the IC bonding region. An opening region 41 may be formed through cutting such that the supporting pad 6 can fit in the opening region 41. The supporting pad 6 may be placed within the opening region 41. The supporting pad 6 may be used to provide support to the IC bonding region on the flexible display body 1.

The supporting pad 6 may be placed within the opening region 41 such that the supporting pad 6 may bonded onto the flexible display body 1. The bonding formed between the supporting pad 6 and the flexible display body 1 may be formed on a platform of a bonding machine.

Specifically, certain adjustment can be made to the platform of the bonding machine. The supporting pad 6 may be placed or fixed on the platform 5. When in operation, the bonding machine may bring or drive the supporting pad 6 to move towards the flexible display body 1 from below the flexible display body 1, and place the supporting pad 6 in the opening region 41. The supporting pad 6 may be bonded to the back surface of the flexible display body 1. The movement of the platform 5, driven by the bonding machine, may drive the supporting pad 6 to provide support to the flexible display body 1 automatically. The operation can be desirably accurate. Because the opening region 41 may correspond to the IC bonding region, the supporting pad 6 may provide support to the metal wires connecting the IC chip 3 to the flexible display body 1. Thus, the IC chip 3 can be bonded accurately to the desired position.

Further, in some embodiments, the surface area of the supporting pad 6 may be larger than the area of the IC bonding region such that the supporting pad may cover the entire area of the IC bonding region from the back. Thus, the supporting pad 6 may provide better support to the IC chip 3. In certain other embodiments, the surface area of the supporting pad 6 may be smaller than the area of the IC bonding region. In this case, the supporting pad 6 may also provide sufficient support to the IC chip 3.

As shown in FIG. 6, in some embodiments, the thickness of the supporting pad 6 may be the same as the thickness of the stiffening film 4.

In some embodiments, the area of the supporting pad 6 may match the area of opening region 41.

Specifically, the area of the supporting pad 6 may be the same as the area of the opening region 41, and the shape of the supporting pad 6 may closely match the shape of the opening region 41. Thus, the supporting pad 6 and the stiffening film 4 may completely match each other and the subsequently-formed flexible display panel may be more planar. The area of the supporting pad 6 may be less than the area of the opening region 41, and the supporting pad 6 may still fit into the opening region 41 to provide support to the flexible display body 1. Because of the support provided by the supporting pad 6, the probes of the CCD in the bonding machine may accurately locate the alignment marks on the IC chip 3 and on the flexible display body 1. The IC chip 3 can be accurately aligned with the flexible display body 1.

In some embodiments, the supporting pad 6 may be made of metal. In certain other embodiments, the supporting pad 6 may be made of rubber. The material of the supporting pad may be determined according to different applications and is not limited by the embodiments of the present disclosure.

Figure 5:
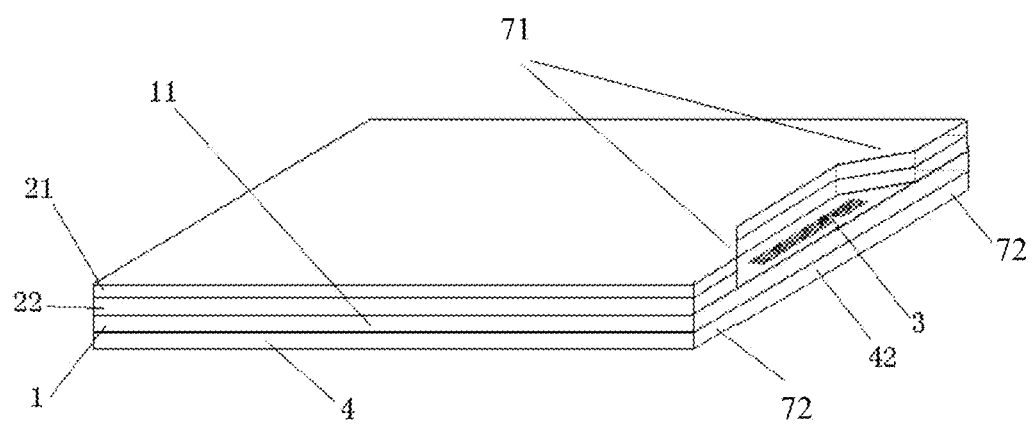
FIG. 5 illustrates the structure of another exemplary flexible display panel according to the embodiments of the present disclosure.

Compared to the embodiment illustrated in FIGS. 2 to 4, the embodiment illustrated in FIGS. 5 to 7 may provide improved support to the flexible display body 1. The IC bonding region on the flexible display body 1 in FIGS. 5 to 7 may be flatter and less susceptible to curling or folding after the flexible display body 1 is separated from the glass substrate. The alignment process can be more accurate and production efficiency can be improved.

In one embodiment, for fast mass production, raw materials to form a plurality of flexible display panels can be provided. For example, a large bonding or adhesive sheet and a large flexible display body sheet may be provided. The large flexible display body sheet may be bonded or attached to a glass substrate and may be divided into a plurality of flexible display bodies 1. The large bonding sheet may be divided into a plurality of encapsulation layers 2 for the plurality of flexible display bodies 1. The operation to form a plurality of flexible display panels using the large bonding sheet and the large flexible display body sheet may include the following process.

First, the large bonding sheet may be divided into a plurality of encapsulation layers 2 for a plurality of flexible display bodies 1, and the large flexible display body sheet on the glass substrate may be divided into a plurality of flexible display bodies 1. Each one of the encapsulation layer 2 in the large bonding sheet may correspond to a flexible display body 1 in the large flexible display body sheet.

Further, a first opening may be formed or cut on each piece of encapsulation layer 2 in the large bonding sheet, and each first opening may correspond to the IC bonding region on the corresponding flexible display body 1. The IC bonding region may be reserved or formed previously for the subsequent bonding process. The two sides of the first opening may correspond to the two side stiffening portions 7 for supporting the IC bonding region.

Further, edges of the large bonding sheet may be aligned with the edges of the large flexible display body sheet on the glass substrate so that the large bonding sheet may be bonded to the large flexible display body sheet. Each piece of encapsulation layer 2 on the large bonding sheet may be aligned with and bonded to the corresponding flexible display body 1. The two stiffening portions 7 may be aligned with and bonded to the two sides of the IC bonding region.

Further, the large bonding sheet and the large flexible display body sheet, bonded together, may be separated from the glass substrate.

Further, laser radiation or a punching process may be used to cut the large bonding sheet and the large flexible display body sheet, bonded together, into a plurality of smaller units. Each unit may be an encapsulation layer 2 and the corresponding flexible display body 1.

Further, in each first opening, an IC chip 3 may be bonded to the corresponding flexible display body 1 to form electrical connection with the flexible display body 1.

The cutting of the large bonding sheet and the cutting of the large flexible display body sheet should be kept in accordance with each other to ensure when the IC chips 3 are bonded onto the corresponding flexible display bodies 1, the IC chips 3 can be bonded accurately to the corresponding IC bonding regions. The bonding of the anisotropic adhesive, the pre-pressing process, and the pressing process may be kept in accordance with each other such that each process may be performed accurately in the corresponding position. Thus, the bonding of the anisotropic adhesive, the pre-pressing process, and the pressing process can be implemented by automatic position recognition and the subsequently bonding operations.

Further, a stiffening film 4 may be bonded onto the other side of each flexible display body 1 (back side) such that the stiffening film 4 and the encapsulation layer 2 may be bonded onto the two opposing sides of the corresponding flexible display body 1.

Further, an opening region 41 may be cut on each stiffening film 4. The position of the opening region 41 may correspond to the position of the IC chip 3. A supporting pad 6 may be placed in the opening region 41 to be in contact with the flexible display body 1.

As shown in FIGS. 5 and 7, in one embodiment, the stiffening film 4 may further include a direct stiffening portion 42. The direct stiffening portion 42 may directly correspond to or contact the IC bonding region. The direction stiffening portion 42, the main stiffening film portion 43, and the side stiffening portions 72 may be connected together.

In one embodiment, the stiffening film 4 may also not include the opening region 41. In this case, the supporting pad 6 may not be required to support the flexible display body 1. That is, the stiffening film 4 may be uncut. The stiffening film 4 may be aligned with and bonded onto the flexible display body 1. The stiffening film 4 may include a direct stiffening portion 42, a main stiffening film portion 43, and side stiffening portions 21 connected together. The direct stiffening portion 42 may correspond to the IC bonding region. The side stiffening portions 72 may correspond to the two sides of the IC bonding region.

It should be noted that the supporting pad 6 may also be combined with the stiffening film 4 to provide support to the flexible display body 1. In this case, the stiffening film 4 may also include a direct stiffening portion 42, a main stiffening film portion 43, and side stiffening portions 21 connected together. The direct stiffening portion 42 may correspond to the IC bonding region. The side stiffening portions 72 may correspond to the two sides of the IC bonding region. The supporting pad 6 may be placed between the direct stiffening portion 42 and the IC bonding region. The direct stiffening portion 42 may improve the support to the IC bonding region.

Another aspect of the present disclosure provides an apparatus for forming a display panel. The apparatus may be a bonding machine for bonding an IC chip 3 onto the corresponding bonding region on a flexible display body 1. The bonding machine may include a platform 5 and the supporting pad 6 may be fixed on the platform 5, as shown in FIG. 6. The supporting pad 6 may be used to provide support to the IC bonding region on the flexible display body 1. In one embodiment, the platform 5 may be mounted on a press-mounting component of the bonding machine. The supporting pad 6 may be placed on the platform 5. When in operation, the press-mounting component may move and drive the platform 5 and the supporting pad 6 to move towards the flexible display body 1. The supporting pad 6 may be driven to contact the bonding region for the IC pad 3 from the back of the flexible display body 1. The movement of the press-mounting component may drive the supporting pad 6 to provide support to the flexible display body 1. The operation of the press-mounting component may keep the position of the supporting pad 6 in accordance with the IC bonding region. The supporting pad 6 may provide support to the metal wires, connecting the IC chip 3 and the flexible display body 1, in the IC bonding region. The support for the IC chip 3 may be improved such that the IC bonding region on the flexible display body 1 can be prevented from curling or folding. Thus, when the IC chip 1 is aligned with and bonded onto the flexible display body 1, the operation can be accurate and convenient.

Another aspect of the present disclosure provides a flexible display panel. As shown in FIG. 2, the flexible display panel may include a flexible display body 1, a stiffening component 8, and an IC chip 3.

The stiffening component 8 may be placed on the flexible display body 1. An IC bonding region may be included on the flexible display body 1. The stiffening component 8 may include two side stiffening portions 71 corresponding to at least two sides of the IC bonding region. The IC chip 3 may be placed in the IC bonding region on the flexible display body 1.

In one embodiment, the flexible display body 1 may be the flexible display panel. In the disclosed flexible display panel, by placing or attaching a stiffening component 8 on the flexible display body 1, support can be provided to the flexible display body 1 such that the flexible display body 1 can be prevented from curling or folding after separated from the glass substrate. Further, the stiffening component 8 may include side stiffening portions 71. The side stiffening portions 71 may correspond to at least two sides of the IC bonding region. That is, portions of the stiffening component 8 may be placed on at least two sides of the IC bonding region such that the side stiffening portions 71 may provide protection and support to the IC bonding region on the flexible display body 1. The IC bonding region on the flexible display body 1 may be prevented from curling or folding. Thus, when the IC chip 1 is aligned with and bonded onto the flexible display body 1, the operation can be accurate and convenient.

As shown in FIG. 4, in some embodiments, the stiffening component 8 may be the encapsulation layer 2 of the flexible display body 1. The encapsulation layer 2 may include the main encapsulation portion 23 and side stiffening portions 71. The main encapsulation portion 23 may correspond to the display region 11 of the flexible display body 1. The main encapsulation portion 23 may extend to the sides to form side stiffening portions 71.

In one embodiment, by using the encapsulation layer 2 of the flexible display body 1 as the stiffening component 8, encapsulating of the flexible display body 1 and improving support for the flexible display body 1 can be realized simultaneously. The flexible display body 1 can be prevented from curling or folding after being separated from the glass substrate. The side stiffening portions 71 may cover the two sides of the IC bonding region. Besides the side stiffening portions 71, the rest of the encapsulation layer 2 may be referred as the main encapsulation portion 23. The main encapsulation portion 23 may correspond to the display region 11 of the flexible display body 1. The stiffening component 8 may be formed through various means. For example, the stiffening component 8 may be a single-layered adhesive or bonding film with certain thickness and certain mechanical strength, or may be a multiple-layered adhesives or bonding films stacked together.

As shown in FIG. 3, in some embodiments, the encapsulation layer 2 may include a water-repellent layer 21 and a surface-adhesive layer 22. The water-repellent layer 21 may be bonded to the surface-adhesive layer 22, and the surface-adhesive layer 22 may be further bonded to the flexible display body 1.

The encapsulation layer 2 may be formed by various means. In one embodiment, the water-repellent layer 21 and the surface-adhesive layer 22 may be adhered or bonded together. The water-repellent layer 21 may be an aqueous oxygen barrier layer. The water-repellent layer 21 may be bonded to the flexible display body 1 through the surface-adhesive layer 22. In one embodiment, the water-repellent layer 21 may have a desired thickness to provide sufficient support to the flexible display body 1. When the water-repellent layer 21 and the surface-adhesive layer 22 are bonded to the flexible display body 1, the first opening may be formed on the water-repellent layer 21 and the surface-adhesive layer 22 separately, e.g., the first opening on the water repellent layer 21 and the first opening on the surface-adhesive layer 22 may be cut separately. Alternatively, the water-repellent layer 21 and the surface-adhesive layer 22 may be bonded onto the flexible display body 1 and the first opening may be formed (e.g., by cutting) in the water-repellent layer 21 and the surface-adhesive layer 22 together. The side stiffening portions 71 may cover both the water-repellent layer 21 and the surface-adhesive layer 22. By aligning the water-repellent layer 21 and the surface-adhesive layer 22 with the flexible display body 1 and bonding the water-repellent layer 21 and the surface-adhesive layer 22 onto the flexible display body 1 with pressure, the side stiffening portions 71 may correspond to the sides of the IC bonding region to provide support for the flexible display body 1. Thus, the flexible display panel can be encapsulated.

As shown in FIG. 6, the stiffening component 8 may also include a stiffening film 4. The stiffening film 4 may be bonded to the other surface of the flexible display body 1, i.e., the surface not bonded with the encapsulation layer 2. The stiffening film 4 may include a main stiffening film portion 43 corresponding to the display region 11 of the flexible display body 1, and side stiffening portions 72 extended from the main stiffening film portion 43. The main stiffening film portion 43 and the side stiffening portions 72 may form an opening region 41. The opening region 41 may correspond to the IC bonding region.

In one embodiment, the stiffening component 8 may include two layers, i.e., the encapsulation layer 2 and the stiffening film 4. The encapsulation layer 2 may be bonded to one surface (e.g., the front surface) of the flexible display body 1 and the stiffening film 4 may be bonded to the other surface (e.g., the back surface) of the flexible display body 1. That is, in practice, when more support for the flexible display body 1 is required, a stiffening film 4 may be bonded to the other surface of the flexible display body 1, i.e., the surface not bonded with the encapsulation layer 2. The stiffening film 4 may provide additional support to the encapsulation layer 2 for supporting the flexible display body 1. The main stiffening film portion 43 on the stiffening film 4 may correspond to the display region 11 of the flexible display body 1.

The portions extended from the main stiffening film portion 43 may be the side stiffening portions 72. Similarly to the side stiffening portions 71, the side stiffening portions 72 may be bonded to the sides of the IC bonding region to provide support for the bonding region.

As shown in FIG. 6, in one embodiment, the stiffening component 8 may be the stiffening film 4. The stiffening film 4 may be bonded on the other surface, i.e., the side not bonded with the encapsulation layer 2, of the flexible display body 1. The stiffening film 4 may include a main stiffening film portion 43 corresponding to the display region 11 of the flexible display body 1, and side stiffening portions 72 extended from the main stiffening film portion 43. The main stiffening film portion 43 and the side stiffening portions 72 may form an opening region 41. The opening region 41 may correspond to the IC bonding region.

In one embodiment, the stiffening component 8 may only include a single-layered stiffening film 4. The single-layered stiffening film 4 may be bonded onto the other surface, i.e., the back surface or the side/surface not bonded with the encapsulation layer 2, of the flexible display body 1. Similarly, the stiffening film 4 may include a main stiffening film portion 43 corresponding to the display region 11 of the flexible display body 1, and side stiffening portions 72 extended from the main stiffening film portion 43. The side stiffening portions 7 may be bonded on the sides of the IC bonding region to provide sufficient support to the flexible display body 1. Thus, the flexible display body 1 may be prevented from curling or folding.

As shown in FIG. 6, in one embodiment, the main stiffening film portion 43 and the side stiffening portions 72 may form an opening region 41. The device or machine used for bonding the IC chip 3 onto the IC bonding region on the flexible display body 1 may include a platform 5. A supporting pad 6 may be fixed on the platform 5. The supporting pad 6 may be used to provide support to the IC bonding region in the opening region 41.

The stiffening film 4 may be a back film. A back film often has large elastic modulus. Under pressure, a back film is less susceptible to sagging. Considerable sagging of the flexible display body 1 may cause the metal wires connecting the IC chip 3 and the flexible display body 1 to break. Thus, the supporting pad 6 may be added to provide protection and support to the metal wires connecting the IC chip 3 and the flexible display body 1.

In one embodiment, when in operation, the flexible display body 1 may be placed flat on a supporting surface. As shown in FIGS. 6 and 7, the encapsulation layer 2 and the IC chip 3 may be placed on the front surface of the flexible display body 1, and the stiffening film 4 may be bonded on the back surface of the flexible display body 1. The area defined by the main stiffening film portion 43 and the side stiffening portions 72 may correspond to the IC bonding region. An opening region 41 may be formed through cutting such that the supporting pad 6 can fit in the opening region 41. The supporting pad 6 may be placed within the opening region 41. The supporting pad 6 may be used to provide support to the IC bonding region on the flexible display body 1.

The supporting pad 6 may be placed within the opening region 41 such that the supporting pad 6 may bonded onto the flexible display body 1. The bonding formed between the supporting pad 6 and the flexible display body 1 may be formed on a platform of a bonding machine.

Specifically, certain adjustment can be made to the platform of the bonding machine. The supporting pad 6 may be placed on the platform 5. When in operation, the bonding machine may bring or drive the supporting pad 6 to move towards the flexible display body 1 from below the flexible display body 1, and place the supporting pad 6 in the opening region 41. The supporting pad 6 may be bonded to the back surface of the flexible display body 1. The movement of the platform 5, driven by the bonding machine, may drive the supporting pad 6 to provide support to the flexible display body 1 automatically. The operation can be desirably accurate. Because the opening region 41 may correspond to the IC bonding region, the supporting pad 6 may provide support to the metal wires connecting the IC chip 3 to the flexible display body 1. Thus, the IC chip 3 can be bonded accurately to the desired position.

Further, in some embodiments, the surface area of the supporting pad 6 may be larger than the area of the IC bonding region such that the supporting pad may cover the entire area of the IC bonding region from the back. Thus, the supporting pad 6 may provide better support to the IC chip 3. In certain other embodiments, the surface area of the supporting pad 6 may be smaller than the area of the IC bonding region. In this case, the supporting pad 6 may also provide sufficient support to the IC chip 3.

As shown in FIG. 6, in some embodiments, the thickness of the supporting pad 6 may be the same as the thickness of the stiffening film 4.

In some embodiments, the area of the supporting pad 6 may match the area of opening region 41.

Specifically, the area of the supporting pad 6 may be the same as the area of the stiffening film 4, and the shape of the supporting pad 6 may closely match the shape of the opening region 41. Thus, the supporting pad 6 and the stiffening film 4 may completely match each other and the subsequently-formed flexible display panel may be more planar. The area of the supporting pad 6 may be less than the area of the opening region 42, and the supporting pad 6 may still fit into the opening region 42 to provide support to the flexible display body 1. Because of the support provided by the supporting pad 6, the probes of the CCD in the bonding machine may accurately locate the alignment marks on the IC chip 3 and on the flexible display body 1. The IC chip 3 can be accurately aligned with the flexible display body 1.

In some embodiments, the supporting pad 6 may be made of metal. In certain other embodiments, the supporting pad 6 may be made of rubber. The material of the supporting pad may be determined according to different applications and is not limited by the embodiments of the present disclosure.

As shown in FIGS. 5 and 7, in one embodiment, the stiffening film 4 may further include a direct stiffening portion 42. The direct stiffening portion 42 may directly correspond to or contact the IC bonding region. The direction stiffening portion 42, the main stiffening film portion 43, and the side stiffening portions 72 may be connected together.

In one embodiment, the stiffening film 4 may also not include the opening region 41. In this case, the supporting pad 6 may not be required to support the flexible display body 1. That is, the stiffening film 4 may be uncut. The stiffening film 4 may be aligned with and bonded onto the flexible display body 1. The stiffening film 4 may include a direct stiffening portion 42, a main stiffening film portion 43, and side stiffening portions 21 connected together. The direct stiffening portion 42 may correspond to the IC bonding region. The side stiffening portions 72 may correspond to the two sides of the IC bonding region.

It should be noted that the supporting pad 6 may also be combined with the stiffening film 4 to provide support to the flexible display body 1. In this case, the stiffening film 4 may also include a direct stiffening portion 42, a main stiffening film portion 43, and side stiffening portions 21 connected together. The direct stiffening portion 42 may correspond to the IC bonding region. The side stiffening portions 72 may correspond to the two sides of the IC bonding region. The supporting pad 6 may be placed between the direct stiffening portion 42 and the IC bonding region. The direct stiffening portion 42 may improve the support to the IC bonding region.

Another aspect of the present disclosure provides a display apparatus. The display apparatus may incorporate the disclosed flexible display panel.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A method for bonding an integrated circuit (IC) chip onto a flexible display body, comprising:
   providing a substrate having a flexible display body thereon;
   aligning a first stiffening component with the flexible display body having an IC bonding region;
   attaching the first stiffening component onto a front surface of the flexible display body;
   separating, after attaching the first stiffening component, the substrate from the first stiffening component and the flexible display body to expose a back surface of the flexible display body; and
   bonding an IC chip onto the IC bonding region.

2. The method according to claim 1, wherein the first stiffening component includes, before aligning the first stiffening component with the flexible display body, an opening region, a main stiffening region, and side stiffening portions surrounding the opening region of the first stiffening component for exposing the IC bonding region.

3. The method according to claim 2, wherein the side stiffening portions are configured to extend from the main stiffening region to be attached onto at least two sides of the IC bonding region for providing support to the IC bonding region.

4. The method according to claim 2, wherein the main stiffening region corresponds to a display region of the flexible display body.

5. The method according to claim 1, further including:
   aligning a second stiffening component with the flexible display body; and
   attaching the second stiffening component onto the back surface of the flexible display body.

6. The method according to claim 5, wherein the second stiffening component comprises a back film.

7. The method according to claim 5, wherein the second stiffening component includes an opening region, a main stiffening portion region, and side stiffening portions surrounding the opening region of the second stiffening component corresponding to an area of the IC bonding region.

8. The method according to claim 7, wherein the main stiffening portion region of the second stiffening component corresponds to a display region of the flexible display body and the side stiffening portions of the second stiffening component are configured to extend from the main second stiffening portion region to be attached onto at least two sides of the back surface of the IC bonding region for providing support to the IC bonding region.

9. The method according to claim 7, further including attaching a supporting pad from below the back surface of the flexible display body to contact a back surface of the IC bonding region, wherein a surface area of the supporting pad fits an area of the second opening region and a thickness of the supporting pad being same as a thickness of the second stiffening component.

10. The method according to claim 9, wherein a process to attach the supporting pad onto the back surface of the IC bonding region includes:
    fixing the supporting pad on a platform of a bonding machine; and
    moving the platform towards the back surface of the flexible display body to place the supporting pad in the second opening region and form a contact surface with the back surface of the IC bonding region.

11. The method according to claim 5, wherein the second stiffening component has contact with a back surface of the IC bonding region to provide support.

12. The method according to claim 1, wherein the first stiffening component comprises an encapsulation layer with a water-repellent layer and a surface-adhesive layer, the water-repellent layer being attached on the surface-adhesive layer and the surface-adhesive layer being attached on the front surface of the flexible display body.

13. The method according to claim 1, wherein the substrate is separated from the first stiffening component and the flexible display body by laser or by a punching process.

14. The method according to claim 1, further including applying an anisotropic conductive adhesive onto the IC bonding region before bonding the IC chip onto the IC bonding region.

15. A method for bonding an integrated circuit (IC) chip onto a flexible display body, comprising:
    providing a substrate having a flexible display body thereon;
    aligning a first stiffening component with the flexible display body having an IC bonding region;
    attaching the first stiffening component onto a front surface of the flexible display body;
    separating the substrate from the first stiffening component and the flexible display body to expose a back surface of the flexible display body;
    aligning a second stiffening component with the flexible display body, the second stiffening component including an opening region, a main stiffening portion region, and side stiffening portions surrounding the opening region of the second stiffening component corresponding to an area of the IC bonding region;
    attaching the second stiffening component onto the back surface of the flexible display body; and
    bonding an IC chip onto the IC bonding region.

* * * * *